(12) United States Patent
Scuteri et al.

(10) Patent No.: US 7,317,359 B2
(45) Date of Patent: Jan. 8, 2008

(54) CIRCUITS AND METHODS FOR PHASE LOCKED LOOP LOCK WINDOW DETECTION

(75) Inventors: Jeremy Scuteri, Highland, NY (US); Gregory A. Blum, Lagrangeville, NY (US)

(73) Assignee: Seiko Epson Corporation, Tokyo (JP)

( * ) Notice: Subject to any disclaimer, the term of this patent is extended or adjusted under 35 U.S.C. 154(b) by 61 days.

(21) Appl. No.: 11/349,847

(22) Filed: Feb. 8, 2006

(65) Prior Publication Data

US 2007/0182492 A1    Aug. 9, 2007

(51) Int. Cl.
*H03L 7/089* (2006.01)

(52) U.S. Cl. .................. 331/1 A; 331/DIG. 2

(58) Field of Classification Search ........... 331/1 A, 331/DIG. 2
See application file for complete search history.

(56) References Cited

U.S. PATENT DOCUMENTS

| 5,214,677 | A | * | 5/1993 | Mori ........................... 375/376 |
| 5,327,103 | A |   | 7/1994 | Baron et al. ................. 331/1 A |
| 5,347,232 | A | * | 9/1994 | Nishimichi ................... 331/1 A |
| 5,394,444 | A |   | 2/1995 | Silvey et al. ................. 375/374 |
| 5,555,278 | A | * | 9/1996 | Kondoh ........................ 375/376 |
| 5,563,552 | A | * | 10/1996 | Gersbach et al. ............ 331/1 A |
| 6,762,631 | B1 |   | 7/2004 | Kumar .......................... 327/142 |
| 6,765,444 | B2 |   | 7/2004 | Wang et al. ................... 331/17 |
| 6,879,195 | B2 | * | 4/2005 | Green et al. .................. 327/147 |
| 2005/0073343 | A1 |  | 4/2005 | Kim et al. .................... 327/156 |

FOREIGN PATENT DOCUMENTS

| EP | 0 367 548 | 5/1990 |
| EP | 0 637 138 | 2/1995 |
| JP | 4-119737 | 4/1992 |

* cited by examiner

*Primary Examiner*—Joseph Chang

(57) ABSTRACT

Circuits and methods for detecting the lock status of a phase locked loop (PLL). The circuit generally comprises (a) a controller configured to produce a control signal in response to a reference clock signal, (b) a counter configured to count pulses of an output signal of the PLL (or a periodic derivative of the output signal) in response to the control signal, and (c) a decoder configured to (i) receive a counter output in response to the control signal, and (ii) produce a lock status output based on the counter output. The method generally comprises the steps of (1) counting pulses of a PLL (or a periodic derivative thereof) in response to a reference clock signal, and (2) indicating a lock status based on the number of counted pulses. The present invention advantageously provides a circuit designer the ability to tune the range of acceptable frequencies by choosing an appropriate reference frequency and adjusting the decoder to produce a positive lock status for a desired range of pulse counts.

14 Claims, 5 Drawing Sheets

CIRCUITS AND METHODS FOR PHASE LOCKED LOOP LOCK WINDOW DETECTION

FIELD OF THE INVENTION

The present invention generally relates to phase locked loop (PLL) circuits. More specifically, embodiments of the present invention pertain to methods and circuits for detecting the lock status of a PLL.

DISCUSSION OF THE BACKGROUND

Phase locked loop (PLL) circuits are well known in the data processing art as clock generators which provide stable clock signals having predetermined, stable frequencies. The stability of each frequency is provided as a result of an iterative process which uses a feedback path to compare an output of the phase lock loop circuit with an input signal typically provided by a crystal oscillator.

Conventional lock detection circuits generally determine lock status by detecting a phase difference between a reference clock signal and the PLL-generated clock (or a divided derivative thereof). This approach generally detects a positive lock status for generated frequencies that are nearly exactly the same as the reference frequency. This characteristic is desirable for many applications. However, for some applications it is desirable to detect lock status within a range of frequencies.

Spread spectrum clock generation is one such application. Electronic devices typically generate electromagnetic interference (EMI) when operating. The EMI generated by one electronic device may adversely affect the operation of another electronic device. In order to minimize adverse effects of EMI on other electronic devices, regulatory agencies in many countries have adopted standards which limit the amount of energy an electronic device may radiate at any given frequency.

Electronic devices frequently use a clock signal of some frequency for operation. In many such devices, long traces or wires are used to route the clock signal to various integrated circuit (IC) components. These long wires or traces can act as antennas which, in turn, radiate energy at the clock signal frequency and (in many cases) its harmonics. Since antennas radiate more efficiently as wavelength becomes smaller with respect to antenna length, the amount of energy so radiated increases as the clock frequency increases. Consequently, in sophisticated electronic devices such as, for instance, personal computers, printers, cellular phones and peripheral devices, where clock frequencies are approaching gigahertz speeds, EMI is increasingly problematic.

When substantially all of a clock's energy is at one frequency, EMI energy may exceed regulatory limits at that clock frequency. A well known technique to reduce the peak EMI energy at the clock frequency (and its harmonics) is to use spread spectrum clock generation techniques to spread the energy across a part of the frequency spectrum. Spectrum spreading is commonly used in radio frequency communication to facilitate high-resolution ranging, multiple access, jamming resistant waveforms, and energy density reduction. Therefore it is desirable to detect the lock status of a spread spectrum clock generator over a range of frequencies rather than at a single frequency.

SUMMARY OF THE INVENTION

Embodiments of the present invention relate to circuits and methods for detecting the lock status of a phase locked loop (PLL). The circuit generally comprises (a) a controller configured to produce a control signal in response to a reference clock signal, (b) a counter configured to count pulses of an output signal of the PLL in response to the control signal, and (c) a decoder configured to (i) receive a counter output in response to the control signal, and (ii) produce a lock status output signal based on the counter output. The method generally comprises the steps of (1) counting pulses of a PLL in response to an edge or state of a reference clock signal, and (2) indicating a lock status based on a number of counted pulses.

The circuit can be embodied in a spread spectrum clock generator, and the method may be employed for generating a spread spectrum clock signal. Moreover, the method may be realized by a computer program or waveform containing a set of instructions, which, when executed by a processing device to execute computer-readable instructions, is configured to perform the method or steps thereof.

The present invention advantageously provides a circuit designer the ability to tune the range of acceptable frequencies by choosing an appropriate reference frequency and adjusting the decoder to produce a positive lock status for a desired range of pulse counts. The present invention thereby provides the ability to determine a lock status for a variable frequency signal. The desirable frequency variation is typically small (e.g., on the order of 3% or less), but the resolution of a lock status detector according to the present invention can generally be tuned for large or small frequency variations.

These and other advantages of the present invention will become readily apparent from the detailed description of preferred embodiments below.

DETAILED DESCRIPTION OF THE PREFERRED EMBODIMENTS

Figure 1:
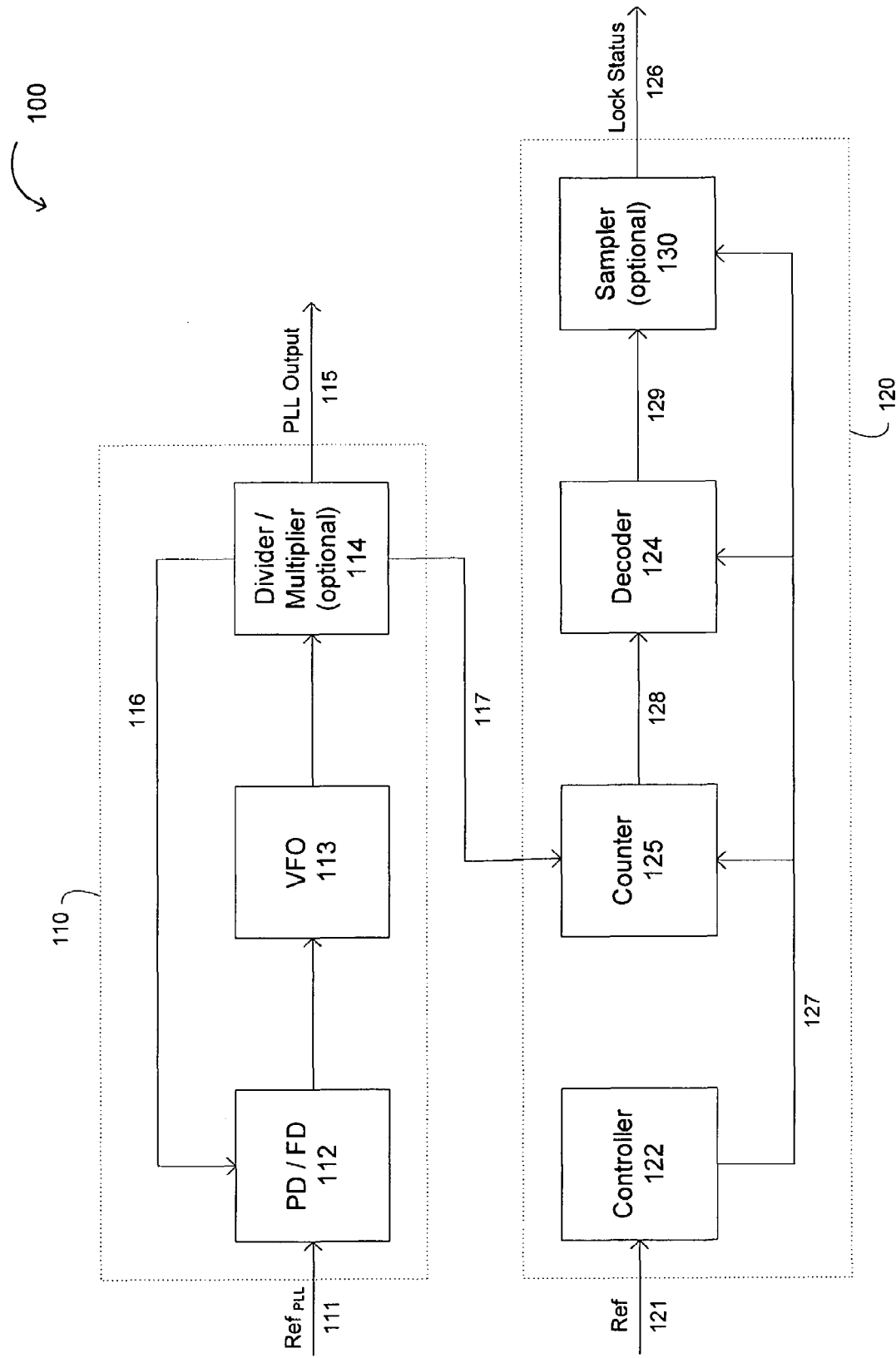
FIG. 1 is a diagram showing an exemplary phase locked loop (PLL) according to the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For convenience and simplicity, the terms "clock," "time," "rate," "period" and "frequency" are generally interchangeable herein, but are generally given their art-recognized meanings. Also, for convenience and simplicity, the terms "data," "signal," "waveform" and "information" may be used interchangeably, as may the terms "connected to," "coupled with," "coupled to," and "in communication with," which may refer to direct and/or indirect connections and/or couplings, as the case may be, but these terms are generally given their art-recognized meanings.

The present invention concerns circuits and methods for detecting the lock status of a phase locked loop (PLL). The circuit generally comprises (a) a controller configured to produce a control signal in response to a reference clock signal, (b) a counter configured to count pulses of an output signal of the PLL in response to said control signal, and (c) a decoder configured to (i) receive a counter output in response to the control signal, and (ii) produce a lock status output based on the counter output. The method generally comprises the steps of (1) counting pulses of a PLL in response to an edge or state of a reference clock signal, and (2) indicating a lock status based on a number of counted pulses.

The present invention further relates to a phase locked loop (PLL). The PLL generally comprises (1) a phase detector configured to receive a first reference clock signal and a first PLL output signal, and to produce a PLL control signal representing a phase difference or a frequency difference between the first reference clock signal and the PLL output signal, (2) a variable-frequency oscillator configured to produce a VFO output signal in response to the PLL control signal, and (3) a lock status detector. The lock status detector generally comprises (a) a controller configured to produce a control signal in response to a second reference clock signal, (b) a counter configured to count pulses of a second PLL output signal in response to the control signal, and (c) a circuit configured to indicate a lock status based on an output of the counter. Each of the first and second PLL output signals generally comprise the VFO output signal and/or a periodic derivative of the VFO output signal. The first and second reference clock signals may be the same reference clock signal, different reference clock signals, the same or different derivative of a reference clock signal, or a reference clock signal and a derivative of an independent reference clock signal.

The invention, in its various aspects, will be explained in greater detail below with regard to exemplary embodiments.

An Exemplary Circuit

In one aspect, the present invention relates to a circuit for detecting the lock status of a PLL. The circuit generally comprises (a) a controller configured to produce a control signal in response to a reference clock signal, (b) a counter configured to count pulses of an output signal of the PLL in response to the control signal, and (c) a decoder configured to (i) receive a counter output in response to the control signal, and (ii) produce a lock status output based on the counter output.

Referring now to FIG. 1, lock status detector 120 receives PLL output 117 from PLL circuit 110. PLL circuit 110 may comprise a conventional phase lock loop circuit, including phase and/or frequency detector 112, variable frequency oscillator 113. PLL circuit 110 may further comprise means 114 for multiplying and/or dividing the output of variable frequency oscillator as needed (e.g., to provide appropriate multiplied and/or divided signal 116 to phase detector 112, PLL output signal or signals 115 (e.g., a signal or signal provided to other components), and/or PLL output signal 117 to lock status detector 120.) It will be recognized that a person skilled in the art may choose multiplication and division factors appropriate to design constraints and/or application requirements.

Lock status detector 120 generally comprises controller 122, counter or counter circuit 125, and decoder 124. Lock status detector 120 may further comprise sampler/correction circuit 130. PLL output 117 may comprise the output signal of variable frequency oscillator 113, or may comprise a multiplied and/or divided copy of that signal.

Controller (or control circuit) 122 generally receives reference clock signal 121, and produces control signal 127 in response to the reference clock signal. Controller 122 may comprise a state machine, where control signal 127 comprises a representation of the current state. Reference clock signal 121 may cause transitions in the state of the state machine (e.g., states may transition at rising and/or falling edges of reference clock signal 121, or in response to levels and/or values of the reference clock signal).

Counter 125 generally receives control signal 127, and counts pulses of PLL output 117 in response to values and/or transitions of control signal 127 to produce counter output 128. Counter 125 may comprise a conventional digital counter circuit (e.g., a conventional 8-bit digital counter), and may further comprise circuitry (e.g., logic circuitry) to alter the behavior of a conventional digital counter circuit in response to control signal 127, generally as described herein.

Decoder 124 generally receives counter output 128, and in response to control signal 127 produces lock status signal 129.

In further embodiments, the controller 122 may cycle through a series of states in response to edges of the reference clock signal. Thus, controller 122 may comprise a state machine. For example, referring now to FIG. 2, on a first reference clock edge 220 the controller may enter a 'reset' state 210 (e.g., on a first falling edge of reference clock 121). Alternatively, the counter may be reset on a rising edge of the reference clock, or when the reference clock has a voltage above or below a predetermined threshold (e.g., corresponding to a binary logic state of "1" or "0"). The controller may reset the counter and/or its output (e.g., the pulse count [e.g., pulse count 230] may be set to 0) in the reset state. Typically, the controller will enter the reset state upon the occurrence of an additional event, such as assertion of a conventional out-of-lock signal, deassertion of a power-up or power-on-reset signal, or other indication to the PLL to determine or confirm a lock status or locked state.

In a further embodiment, on second reference clock edge 221 the controller may enter a 'count' state 211 (e.g., on a first rising edge of reference clock 121). The counter may be configured (e.g., instructed by the controller) to count pulses of the PLL output signal (e.g., PLL output 117) during the count state. For illustrative purposes, an exemplary PLL output waveform 117 is shown. Pulse count 230 (e.g., the number of pulses counted by counter 211 during the 'count' state 211) increments for each pulse of the PLL output signal. Second reference clock edge 221 may be the same transition as, or a complementary transition to, first reference clock edge 220.

In a still further embodiment, on third reference clock edge 222 the controller may enter a 'stop count' state 212. The counter may be configured (e.g., instructed by the controller) to stop counting pulses after the controller enters the stop count state, and the pulse count may be decoded. In one embodiment, the decoder (which may continuously or intermittently [e.g., through one or more gates controlled by the state machine or other control circuit on the chip or in the system] receive the counter output) may provide a multi-bit, decoded output signal representative of the pulse count during the stop count state. Typically, the counter output or counter output pins are sampled using a small, volatile memory such as a register or other plurality or bank of gated flip-flops or latches (not shown), and the decoder decodes the values stored therein. On a fourth reference clock edge 223, the controller may enter a 'sample output' step 213, where the output of the decoder may be sampled similarly to the counter output and logically compared to one or more predetermined counts representative of the high end and/or low end of a "lock window" range (corresponding to the lowest and/or highest acceptable values of a phase—[and optionally frequency—] locked PLL output signal) to determine the lock status of the PLL.

In typical operations the predetermined pulse count may be the ratio of the frequency of PLL output 117 to the frequency of reference clock 121, plus or minus a predetermined variability or margin.

Figure 2:
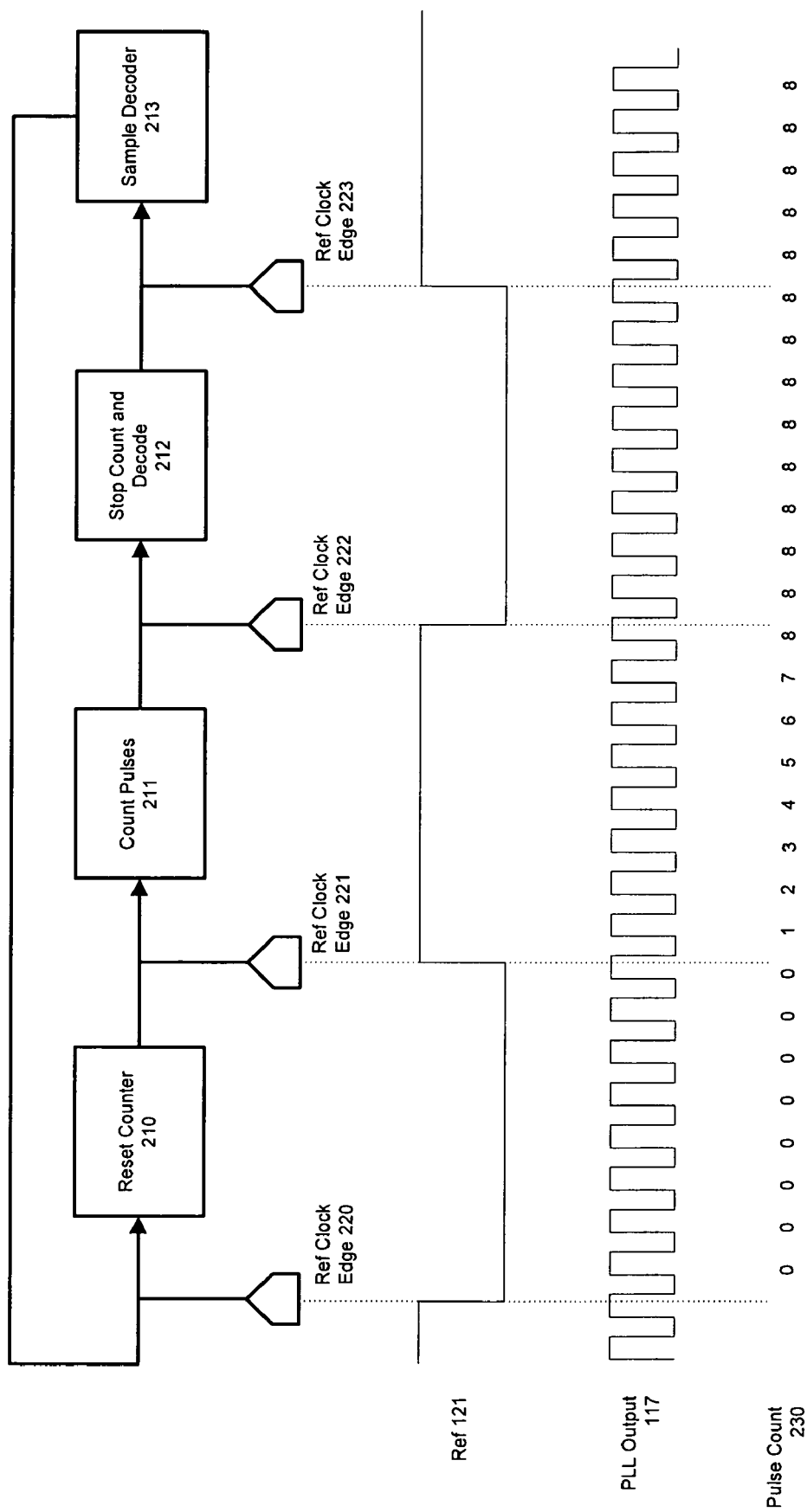
FIG. 2 is a diagram showing exemplary states of a controller of a lock status detector circuit according to the present invention.

In a preferred embodiment, the decoder or decoder circuit may be further configured to produce a positive lock status signal when a numerical value of the counter output falls within a range corresponding to a desired range of frequencies. In particular, one skilled in the art may tune the range of acceptable frequencies by choosing an appropriate reference frequency and by adjusting the decoder to produce a positive lock status for a desired range of pulse counts. An appropriate range of pulse counts may be calculated according to the equation:

$$CountRange = \frac{f_{VCOmin} * DutyCycle_{REFCLK}}{f_{REFCLK}} \text{ to } \frac{f_{VCOmax} * DutyCycle_{REFCLK}}{f_{REFCLK}} \quad (1)$$

where $f_{VCOmin}$ is the minimum desired frequency of the PLL output signal, $f_{VCOmax}$ is the maximum desired frequency of the PLL output signal, $f_{REFCLK}$ is the frequency of the reference clock signal, and $DutyCycle_{REFCLK}$ is the portion of a period of $f_{REFCLK}$ during which pulses will be counted. Thus, a pulse count 230 of eight pulses is shown in FIG. 2, the ratio may be from 100 to 20,000, 250 to 10,000, or about 500 to about 2,000, depending on the frequencies of PLL output 117, reference clock 121, any multiplier and/or divider applied to such clock signals, the duty cycle of the reference clock, and the desired variability of the pulse count. Such variability may be from about 10 ppm to about 5%, 100 ppm to about 3%, or 1000 ppm to about 2.5%. In a typical spread spectrum PLL receiving a 1-25 MHz, 50% duty cycle reference clock and outputting a 1-2 GHz signal, the predetermined pulse count range may be from about 125 to about 2000, ±1-2% in either direction.

It will be recognized that the PLL output signal and reference clock signal received by the lock status detector are not necessarily at the frequencies of the PLL and reference clock themselves. Each signal may be multiplied or divided depending on design constraints and/or application considerations, including any desired precision of the lock status detector. A person skilled in the art may thereby choose the value of the count and the size or range of the count window relatively easily, in accordance with the teachings herein.

Therefore, a lock status detection circuit according to the present invention advantageously offers flexibility in the size of the counter that is used, the minimum resolution of the lock detector, and/or the power consumption of the circuit (e.g., because one or both of the clock signals may be divided to enable the use of slower, lower power components). To facilitate a robust design, a circuit designer may round down the lower number of the count range and round up the higher number of the count range to account for potential phase differences between the PLL output signal and the reference clock output that could shift the count by one. Accordingly, the difference between the maximum and minimum counts should be at least three, but it may be higher (e.g., 5, 7, 15, 25, etc.).

Figure 5:
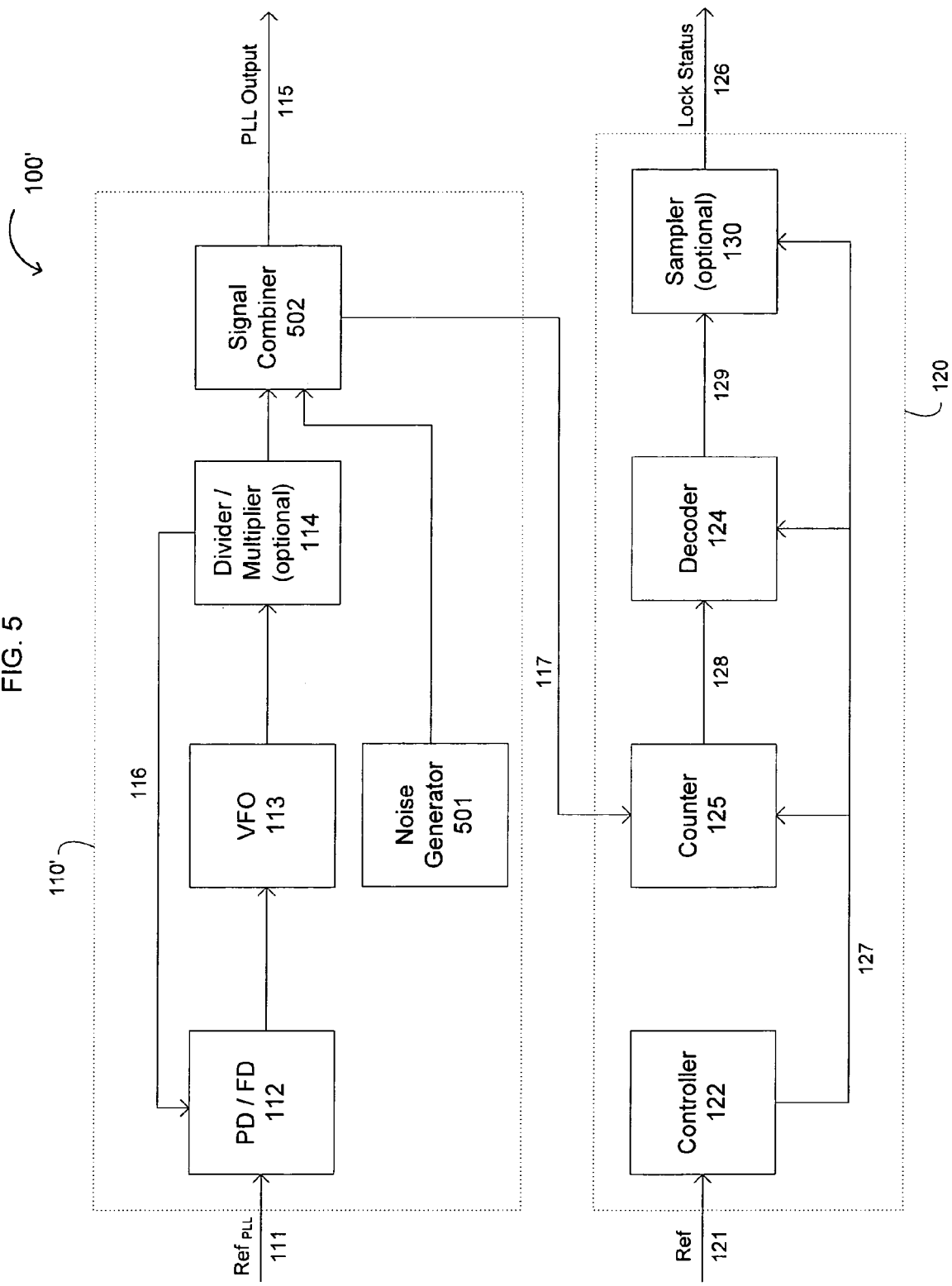
FIG. 5 is a diagram showing an exemplary spread spectrum clock generator (SSCG) according to the present invention.

In a further embodiment, a spread spectrum clock generator may advantageously incorporate a lock status detector capable of accepting a range of frequencies according to the present invention. Referring now to FIG. 5, spread spectrum clock generator circuit 110' may provide spread spectrum clock signal 117 to lock status detector 120. In one embodiment, spread spectrum clock generator 110' may comprise phase detector 112, variable frequency oscillator 113, and noise generator 501. Noise generator 501 is conventional in the field of spread spectrum clock generators. Signal combiner 502 may combine the output of noise generator 501 with the output of VFO 113 to produce a spread spectrum clock signal.

In another embodiment, the circuit may further comprise a correction (or confirmation) circuit configured to receive the lock status signal and to produce a corrected lock status signal in response to a count of consecutive positive decoded lock status signals. A single positive lock status signal may be transient. Therefore it may be desirable to sample the decoded lock status signal and to produce a confirmed positive lock status only after receiving an appropriate number of consecutive positive decoded lock status signals. In a preferred embodiment, the correction (or confirmation) circuit may be configured to produce a corrected or confirmed lock status signal in response to a count of at least two consecutive positive lock status signals.

Figure 3:
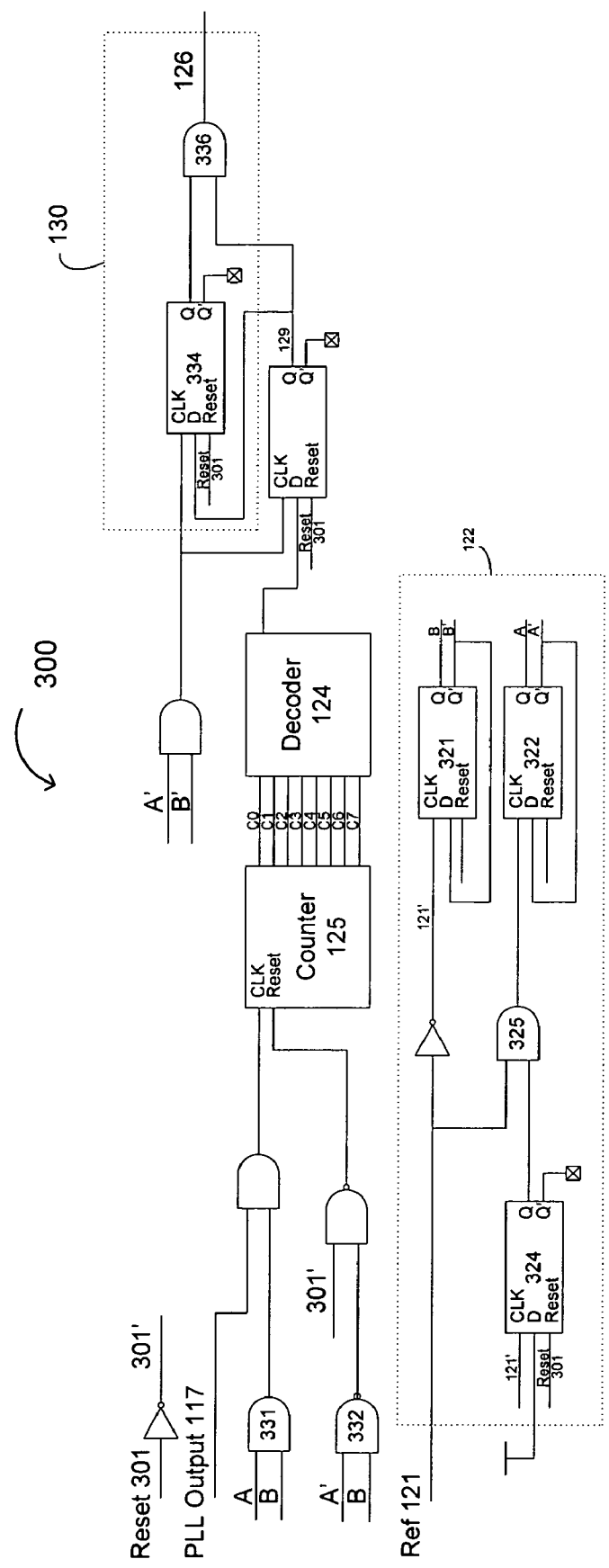
FIG. 3 is a circuit diagram of an exemplary embodiment of a lock status detector according to the present invention.

Referring now to FIG. 3, an implementation of lock status detector circuit 300 according to the present invention is shown. Controller 122 comprises flip flops 321 and 322, forming a state machine with four states that may be continuously cycled. For example, the states may be incremented on each transitioning edge of reference clock signal 121. In the first state, counter 125 may be reset (e.g., by appropriate states of controller 122 outputs A and B' and Reset input 301). In the second state, the PLL output signal 117 may be applied or input to counter 125 through appropriate logic (e.g., AND gates including AND gate 331 receiving state machine outputs A and B from controller 122), incrementing the counter on each rising edge. In the third state, counter 125 may be disabled (e.g., by appropriate states of outputs A and B from controller 122), which prevents it from being further incremented. Also in the third state, the final counter output is decoded by decoder 124 (which may advantageously stabilize the decoder output during the third state; e.g., during a half-cycle of the reference clock 121). In the fourth state, the decoded counter output may be sampled (e.g., stored in sampler 130, at least in part in response to appropriate states of outputs A' and B' from controller 122), and the sampled output (either signal 129 or 126) may be provided to a comparator or other logic configured to compare the pulse count to minimum and/or maximum acceptable pulse count values to determine whether the frequency of PLL output signal 117 is within the lock detection window. The cycle of states may then repeat.

To begin operation of the lock status detector circuit 300, "reset" signal 301 may be pulsed high to place controller 122 in a known state. Signal 301 may then be held low. In the exemplary implementation of FIG. 3, the output of D-type flip flop 321 should be toggled before D-type flip-flop 322, as it will affect the order of the four states that the state machine cycles through. This may be accomplished by using a conventional edge detection scheme, implemented with flip-flop 324 and gate 325. On the first falling edge of reference clock signal 121, output A' of flip-flop 322 and output B of flip-flop 321 may be high, generally corresponding the first state of the state machine (e.g., state 210 of FIG. 2). These signals may be fed to gate 332 in order to reset counter 125.

On the following rising edge of reference clock signal 121, output A of flip-flop 322 and output B of flip-flop 321 may be high, corresponding to the second state of the state machine (e.g., state 211 of FIG. 2). These signals may be fed to gate 331, allowing PLL output signal 117 to be fed through to the "CLK" input of counter 125. The counter may thereby increment with each rising edge of PLL output signal 117.

On the next falling edge of reference clock signal 121, output A of flip-flop 322 and output B' of flip-flop 321 may be high, corresponding to the third state of the state machine (e.g., state 212 of FIG. 2). In this state, counter 125 may be disabled, and decoder 124 may decode the counter output. Generally, if the counter outputs are within the lock detection window, then the output of decoder 124 will be set high.

On the next rising edge of reference clock signal 121, output A' of flip-flop 322 and output B' of flip-flop 321 may be high, corresponding to a fourth state of the state machine (e.g., state 213 of FIG. 2). In this state, D-type flip-flop 130 may latch the output of decoder 124 onto output 129, thus sampling the lock status signal from decoder 124.

Lock status detector circuit 300 may further comprise a correction or confirmation circuit 130, configured to receive the lock status signal and to produce a corrected lock status signal. A single positive lock status signal may be transient. Therefore, it may be desirable to sample the lock status signal from decoder 124 a second time and produce a positive lock status (e.g., signal 126) only after receiving an appropriate number of consecutive positive lock status signals. In the exemplary embodiment of FIG. 3, correction circuit 130 may comprise D-type flip-flop 334 and gate 336, ensuring that the output of the decoder must be high for two consecutive samplings before corrected lock status signal 126 becomes high.

In one exemplary embodiment, a 1.5 GHz PLL may be locked to a 25 MHz reference clock. In a spread spectrum clocking embodiment, the lock detection window may comprise a rage of from 1.478 GHz to 1.513 GHz. It will be recognized that one skilled in the art may enlarge or shrink the lock detection window by changing the decoder to accommodate a larger or smaller range of counts from the counter or by changing the division of the reference clock to sample the oscillator over a smaller or larger period, which could also result in the need for a larger or smaller counter and a different decoder, which are easily implemented by one skilled in the art using conventional components and techniques.

A 1.5 GHz PLL output signal may initially be divided by four, and the resulting 375 MHz signal may be provided to the lock status detector (e.g., PLL output signal 117). Dividing a 1.5 GHz signal by four advantageously allows for lower speed and/or lower power logic circuits (e.g. CMOS logic elements) to be used. A 25 MHz reference clock may be divided by 27, resulting in approximately a 925.926 kHz signal, and fed into the reference clock signal 121 input of lock status detector circuit 300. Due to the odd division ratio, the duty cycle of the reference clock signal 121 input may be 33.3% instead of the 50%. This may be accounted for in the decoder by adjusting the size of the lock detection window (e.g., calculating the range of acceptable pulse counts according to Equation 1). It will be recognized a person skilled in the art may choose division ratios of the reference clock signal and the PLL output signal to accommodate design choices and/or design or application constraints.

Figure 4:
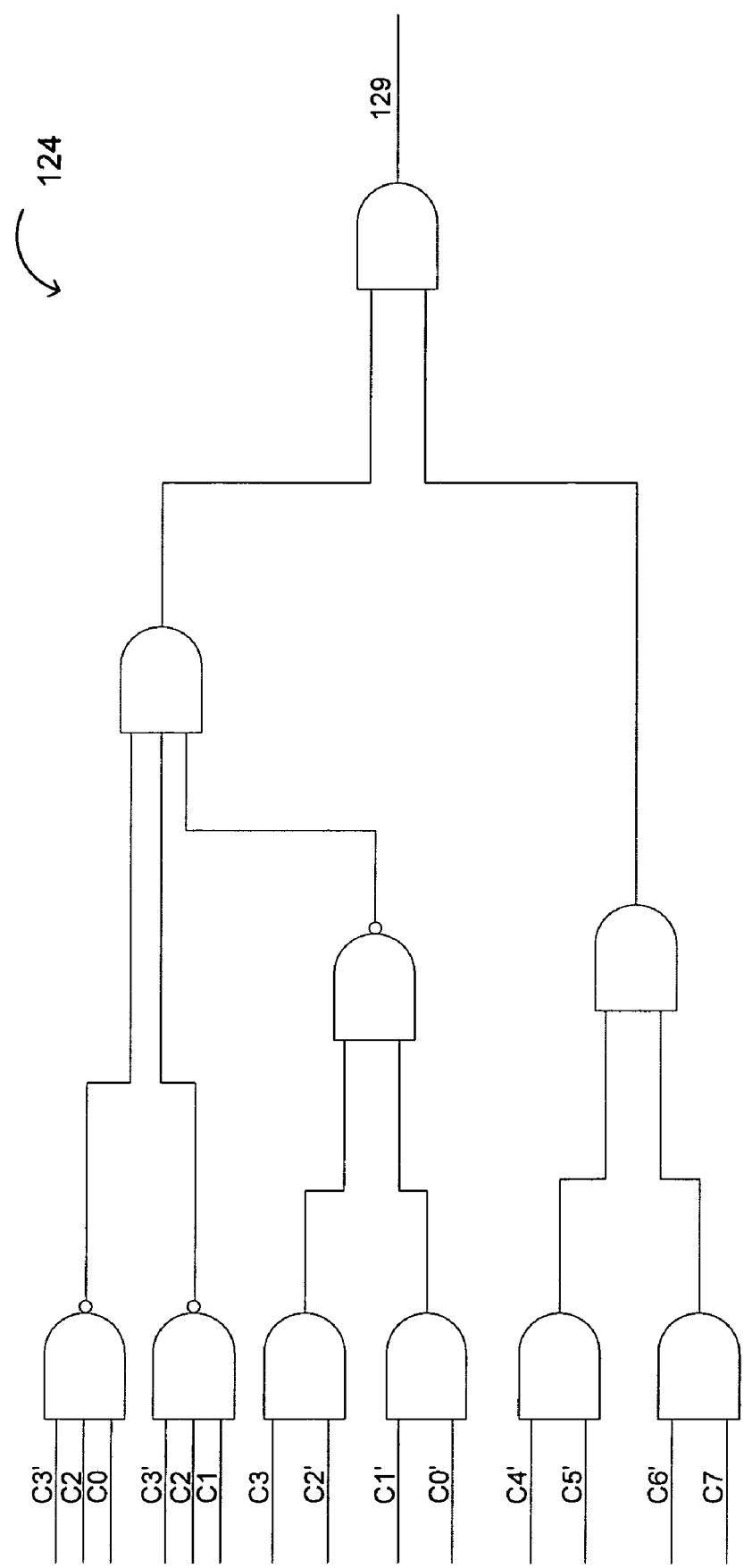
FIG. 4 is a circuit diagram of an exemplary embodiment of a decoder of a lock status detector according to the present invention.

Referring again to FIG. 3, counter 125 may comprise an 8-bit counter, although any number of bits of at least 3, 4 or more (e.g., from 3 to 16, 4 to 12, or 6 to 10) may be employed. In an exemplary embodiment, decoder 124 may comprise the circuit of FIG. 4, which may be implemented for an ideal count range of 133 to 136. It will be recognized that a person skilled in the art may design a decoder or decoder circuit to accommodate other acceptable count ranges. It will be further recognized that the decoder may alternatively be implemented in firmware and/or software, or that the decoder may be programmable to accommodate selection of acceptable count ranges. Thus, the invention may also include algorithms, computer program(s) and/or software, implementable and/or executable in a general purpose computer or workstation equipped with a conventional digital signal processor, configured to perform one or more steps of the inventive method (described below) and/or one or more operations of the hardware described herein.

An Exemplary Method

In another aspect, the present invention concerns a method for detecting a lock status of a PLL. The method generally includes the steps of (1) counting pulses of an output signal of the PLL in response to an edge or state of a reference clock signal, and (2) indicating a lock status based on a number of counted pulses.

In further embodiments, the method may include the step of resetting the number of counted pulses (e.g., setting the count to zero) upon detecting an edge of the reference clock signal. This edge may be a predetermined edge such as a first rising or falling edge, that may further occur following a predetermined condition (e.g., an out-of-lock or power-on-reset condition). Alternatively (or additionally), the method may include the step of starting the counting step upon detecting an(other) edge of the reference clock signal. This edge may be the first edge, or when the method comprises both resetting the number of counted pulses, the counting step may be started upon detecting a subsequent edge of the reference clock signal (which may be the same as or complementary to the reference clock edge that resets the number of counted pulses).

Additionally, the method may include the step of stopping the counting step upon detecting another (e.g., a second) edge of the reference clock signal. The second edge may be the same as or complementary to the first edge. In another embodiment, the producing step may comprise decoding the number of pulses after detecting another (e.g., a third) edge of the reference clock signal (which, of course, may be the same as or complementary to the second edge). The producing step may further include producing a positive lock status signal when the number of counted pulses falls within a range corresponding to a desired frequency range.

In another embodiment, the method may further include the step of correcting or confirming the lock status, and/or producing a corrected or confirmed lock status signal, in response to a number or count of consecutive positive lock status signals. In a further embodiment, the correcting or confirming step may further comprise producing a corrected or confirmed lock status signal in response to (a count of) at least two consecutive positive lock status signals.

In a preferred embodiment, a method for generating a spread spectrum clock signal may include the present method of detecting lock status. In a further embodiment, the method may include a step of modulating an output of the PLL according to a spread spectrum algorithm.

As mentioned above, a further aspect of the invention relates to algorithms and/or software that implement the above method(s) and/or that can perform operations of the inventive hardware described herein. For example, the invention may further relate to a computer program, computer-readable medium or waveform containing a set of instructions which, when executed by an appropriate processing device (e.g., a signal processing device, such as a microcontroller, microprocessor or DSP device), is configured to perform the above-described method and/or algorithm.

For example, the computer program may be on any kind of readable medium, and the computer-readable medium may comprise any medium that can be read by a processing device configured to read the medium and execute code stored thereon or therein, such as a floppy disk, CD-ROM, magnetic tape or hard disk drive. Such code may comprise object code, source code and/or binary code.

The waveform is generally configured for transmission through an appropriate medium, such as copper wire, a conventional twisted pair wireline, a conventional network cable, a conventional optical data transmission cable, or even air or a vacuum (e.g., outer space) for wireless signal transmissions. The waveform and/or code for implementing the present method(s) are generally digital, and are generally configured for processing by a conventional digital data processor (e.g., a microprocessor, microcontroller, or logic circuit such as a programmable gate array, programmable logic circuit/device or application-specific [integrated] circuit).

An Exemplary Phase Locked Loop

In another aspect, the present invention concerns a phase-locked loop (PLL) comprising (a) a phase detector configured to receive a first reference clock signal and a first PLL output signal, and to produce a PLL control signal representing a phase difference or a frequency difference between said first reference clock signal and the PLL output signal, (b) a variable-frequency oscillator (VFO) configured to produce a VFO output signal in response to the PLL control signal, and (c) a lock status detector according to the present invention. The PLL output signal generally comprises either the VFO output signal or a periodic derivative thereof. It will be recognized that the phase detector reference clock signal may comprise (i) a signal independent of the lock status detector reference signal, (ii) the same signal (or a copy thereof) as the lock status detector reference signal, or (iii) a periodic derivative of the lock status detector signal.

Referring again to FIG. 1, the PLL may comprise phase detector 112, VFO 113, and divider/multiplier 114. Phase detector 112 generally receives a first reference clock signal 111 and a first PLL output signal 116, and produces a PLL control signal representing a phase difference or a frequency difference between said first reference clock signal and the PLL output signal. VFO 113 generally produces a VFO output signal in response to the PLL control signal. Divider/multiplier 114 may multiply or divide the VFO output signal as necessary to provide signal 116 to phase detector 112, signal 117 to lock status detector 120, and/or PLL output signal 115.

Lock status detector 120 generally receives PLL output 117 from PLL circuit 110. PLL output 117 may comprise the output signal of variable frequency oscillator 113, or may comprise a multiplied or divided copy of that signal (e.g., VFO signal 113 multiplied or divided by divider/multiplier 114). Controller 122 generally receives reference clock signal 121, and produces control signal 127. Counter 125 generally receives control signal 127 and counts pulses of PLL output 117 in response to control signal 127 to produce counter output 128. Decoder 124 generally receives counter output 128, and in response to control signal 127 produces lock status signal 129.

In a further embodiment of the PLL, the decoder may be further configured to produce a positive lock status signal when a numerical value of said counter output falls within a range corresponding to a desired range of frequencies. In a still further embodiment, the circuit may further comprise a correction or confirmation circuit configured to receive the lock status signal and to produce a corrected or confirmed lock status signal in response to a count of consecutive positive lock status signals. In a preferred embodiment, the correction or confirmation circuit may be configured to produce a positive corrected or confirmed lock status signal in response to a count of at least two consecutive positive (decoded) lock status signals.

CONCLUSION/SUMMARY

Thus, the present invention provides circuits and methods for detecting the lock status of a phase locked loop. The present invention advantageously provides a circuit designer the ability to tune the range of acceptable frequencies by choosing an appropriate reference frequency and adjusting the decoder to produce a positive lock status for a desired range of pulse counts. The present invention thereby provides the ability to determine a lock status for a variable frequency signal. Desirable frequency variation is typically small, but the resolution of a lock status detector according to the present invention can generally be tuned for large or small frequency variations.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A circuit for detecting a lock status of a phase locked loop (PLL), said circuit comprising:

a) a controller configured to produce a control signal in response to a reference clock signal;

b) a counter configured to count pulses of an output signal of said PLL (or a periodic derivative thereof) in response to said control signal; and c) a decoder configured to
   i) receive a counter output in response to said control signal; and
   ii) produce a lock status output signal based on said counter output;

wherein said controller is configured to reset said counter output after said controller detects a first edge of said reference clock signal; and wherein said counter is further configured to start counting said pulses after said controller detects a second edge of said reference clock signal.

2. The circuit of claim 1, wherein said counter is configured to stop counting said pulses after said controller detects a third edge of said reference clock signal.

3. The circuit of claim 2, wherein said decoder is configured to receive said counter output after said controller detects a fourth edge of said reference clock signal.

4. A circuit for detecting a lock status of a phase locked loop (PLL), said circuit comprising:

a) a controller configured to produce a control signal in response to a reference clock signal;

b) a counter configured to count pulses of an output signal of said PLL (or a periodic derivative thereof) in response to said control signal; and c) a decoder configured to
   i) receive a counter output in response to said control signal; and
   ii) produce a lock status output signal based on said counter output;

d) correction/confirmation circuit configured to receive said lock status signal and to produce a corrected or confirmed lock status signal in response to a count of consecutive positive lock status signals.

5. The circuit of claim 4, wherein said count comprises at least 2 consecutive positive lock status signals.

6. A method for detecting a lock status of a phase locked loop (PLL), said method comprising the steps of:

a) counting pulses of an output signal of said PLL or a periodic derivative of said PLL output signal in response to a first edge or state of a reference clock signal;

b) indicating a lock status based on a number of counted pulses;

c) starting said counting step upon detecting a first edge of said reference clock signal; and d) before counting said pulses, resetting said number upon said detecting an earlier edge of said reference clock signal.

7. A method for detecting a lock status of a phase locked loop (PLL), said method comprising the steps of:

a) counting pulses of an output signal of said PLL or a periodic derivative of said PLL output signal in response to a first edge or state of a reference clock signal;

b) indicating a lock status based on a number of counted pulses;

c) starting said counting step upon detecting a first edge of said reference clock signal; and d) stopping said counting step upon detecting a second edge of said reference clock signal.

8. A method for detecting a lock status of a phase locked loop (PLL), said method comprising the steps of:

a) counting pulses of an output signal of said PLL or a periodic derivative of said PLL output signal in response to a first edge or state of a reference clock signal;

b) indicating a lock status based on a number of counted pulses; and c) starting said counting step upon detecting a first edge of said reference clock signal;

wherein said indicating step comprises decoding said number of counted pulses upon detecting a third edge of said reference clock signal.

9. A method for detecting a lock status of a phase locked loop (PLL), said method comprising the steps of:

a) counting pulses of an output signal of said PLL or a periodic derivative of said PLL output signal in response to a first edge or state of a reference clock signal;

b) indicating a lock status based on a number of counted pulses, wherein said indicating step comprises producing a positive lock status signal when said number of counted pulses falls within a range corresponding to a desired frequency range; and c) modulating an output of said PLL according to a spread spectrum algorithm.

10. A method for detecting a lock status of a phase locked loop (PLL), said method comprising the steps of:

a) counting pulses of an output signal of said PLL or a periodic derivative of said PLL output signal in response to a first edge or state of a reference clock signal;

b) indicating a lock status based on a number of counted pulses; and c) correcting or confirming said lock status in response to a count of consecutive positive lock status signals.

11. The method of claim 10, wherein said count comprises at least 2 consecutive positive lock status signals.

12. A phase-locked loop (PLL) comprising:

a) a phase detector configured to receive a first reference clock signal and a first PLL output signal, and to produce a PLL control signal representing a phase difference or a frequency difference between said first reference clock signal and said first PLL output signal;

b) a variable-frequency oscillator configured to produce a VFO output signal in response to said PLL control signal, wherein said first PLL output signal comprises said VFO output signal or a periodic derivative thereof;

c) a lock status detector circuit comprising:
   i) a controller configured to produce a detector control signal in response to a second reference clock signal;
   ii) a counter configured to count pulses of a second PLL output signal in response to said detector control signal, wherein said second PLL output signal comprises said VFO output signal or a periodic derivative thereof; and
   iii) a circuit configured to indicate a lock status based on an output of said counter;

d) correction or confirmation circuit configured to produce a corrected or confirmed lock status signal in response to a count of consecutive positive lock status signals.

13. The PLL of claim 12, wherein said count comprises at least 2 consecutive positive lock status signals.

14. A phase-locked loop (PLL) comprising:
a) a phase detector configured to receive a first reference clock signal and a first PLL output signal, and to produce a PLL control signal representing a phase difference or a frequency difference between said first reference clock signal and said first PLL output signal;
b) a variable-frequency oscillator configured to produce a VFO output signal in response to said PLL control signal, wherein said first PLL output signal comprises said VFO output signal or a periodic derivative thereof;
c) a lock status detector circuit comprising:
  i) a controller configured to produce a detector control signal in response to a second reference clock signal;
  ii) a counter configured to count pulses of a second PLL output signal in response to said detector control signal, wherein said second PLL output signal comprises said VFO output signal or a periodic derivative thereof; and
  iii) a circuit configured to indicate a lock status based on an output of said counter;
d) a noise generator and a signal combiner configured to combine an output of said noise generator and said VFO output signal or derivative thereof.

* * * * *